United States Patent

Vogley et al.

[11] Patent Number: 6,028,781
[45] Date of Patent: Feb. 22, 2000

[54] SELECTABLE INTEGRATED CIRCUIT ASSEMBLY AND METHOD OF OPERATION

[75] Inventors: Wilbur C. Vogley, Missouri City, Tex.; Robert L. Ward, Maple Wood, Minn.

[73] Assignee: Texas Instruments Incorporated, Dallas, Tex.

[21] Appl. No.: 08/993,806

[22] Filed: Dec. 18, 1997

Related U.S. Application Data

[60] Provisional application No. 60/032,446, Dec. 19, 1996, and provisional application No. 60/066,569, Nov. 26, 1997.

[51] Int. Cl.[7] .................................. G11C 5/02; G11C 5/06
[52] U.S. Cl. .............................................. 365/52; 365/63
[58] Field of Search ...................... 365/51, 52, 63, 365/230.03, 226, 189.07

[56] References Cited

U.S. PATENT DOCUMENTS

| | | | |
|---|---|---|---|
| 4,007,452 | 2/1977 | Hoff, Jr. ....................................... | 365/63 |
| 4,375,665 | 3/1983 | Schmidt ....................................... | 365/63 |
| 4,513,372 | 4/1985 | Ziegler et al. ........................ | 365/230.03 |
| 5,357,624 | 10/1994 | Lavan ......................................... | 365/63 |
| 5,677,864 | 10/1997 | Chung ......................................... | 365/63 |
| 5,712,811 | 1/1998 | Kim ............................................. | 365/63 |
| 5,745,426 | 4/1998 | Sekiyama .................................... | 365/63 |
| 5,768,173 | 6/1998 | Seo et al. .................................... | 365/63 |
| 5,796,672 | 8/1998 | Pitz et al. ............................. | 365/203.03 |
| 5,847,985 | 12/1998 | Mitani et al. .............................. | 365/63 |

*Primary Examiner*—Trong Phan
*Attorney, Agent, or Firm*—Robby T. Holland; Richard L. Donaldson

[57] ABSTRACT

According to one aspect of the present invention, a selectable integrated circuit assembly (10) is disclosed. The assembly includes a first plurality of terminals (20) for communicating information to and from an integrated circuit device and a second plurality of terminals (22) for receiving an assembly address. The assembly (10) also includes select logic (14) connected to receive the assembly address and operable to generate select signals based upon the assembly address. The select signals have a selected state and a not-selected state. A plurality of switches (18) are connected between the first plurality of terminals (20) and the integrated circuit device. The plurality of switches (18) are connected to receive the select signals. The switches (18) operate, when the select signals are in the selected state, to connect the first plurality of terminals (20) to the integrated circuit device. When the select signals are in the non-selected state, the switches (18) operate to disconnect the first plurality of terminals (20) from the integrated circuit device. According to one embodiment of the present invention, the assembly is a selectable memory module (10).

31 Claims, 4 Drawing Sheets

SELECTABLE INTEGRATED CIRCUIT ASSEMBLY AND METHOD OF OPERATION

This is a Non Provisional application filed under 35 USC 119(e) and claims priority of prior provisional, TI-18740P, Ser. No. 60/032,446 of inventor Vogley, et al., entitled Selectable Memory Modules and Method of Operation, filed Dec. 19, 1996 and TI-18740P1, Ser. No. 60/066,569, of inventor Vogley, et al, entitled Selectable Integrated Circuit Assembly and Method of Operation, filed Nov. 26, 1997.

TECHNICAL FIELD OF THE INVENTION

This invention relates in general to the field of electronic systems, to a selectable integrated circuit assembly, and more particularly to a selectable memory module and a method of operation.

BACKGROUND OF THE INVENTION

Computer systems, such as personal computers and computer workstations, typically have a number of integrated circuit assemblies as components. These integrated circuit assemblies can include, for example, a mother board. With respect to memory modules, some computer systems require memory modules, for example DRAM or synchronous DRAM modules, that operate at clock frequencies of greater than 100 MHz. Conventional memory modules can have problems with interconnect, noise and physical space that are augmented by such high operating frequencies. A bus system clocked, for example, at 100 MHz should have minimal load per driver to reduce noise and improve integrity of the signal. However, eight conventional memory modules on a single bus driver can add, for example, forty picofarads of capacitance to a base of approximately twenty picofarads.

Many computer system manufacturers contemplate having several gigabytes of main memory which may require a large number of memory modules per bus. This number of memory modules may produce problems with respect to the load on the bus drivers at high operating frequencies. Thus, these systems may need a type of memory module that is different from conventional single in-line memory modules (SIMM) or other conventional memory modules.

SUMMARY OF THE INVENTION

In accordance with the present invention, a selectable integrated circuit assembly, and more particularly a selectable memory module, and a method of operation are provided.

According to one aspect of the present invention, a selectable integrated circuit assembly is disclosed. The assembly includes a first plurality of terminals for communicating information to and from an integrated circuit device and a second plurality of terminals for receiving an assembly address. The assembly also includes select logic connected to receive the assembly address and operable to generate select signals based upon the assembly address. The select signals have a is selected state and a not-selected state. A plurality of switches are connected between the first plurality of terminals and the integrated circuit device. The plurality of switches are connected to receive the select signals. The switches operate, when the select signals are in the selected state, to connect the first plurality of terminals to the integrated circuit device. When the select signals are in the non-selected state, the switches operate to disconnect the first plurality of terminals from the integrated circuit device. According to one embodiment of the present invention, the assembly is a selectable memory module.

According to another aspect of the present invention, a method is provided for selecting a memory module on a memory bus. A plurality of memory modules are connected to a memory bus. Each memory module comprises a first plurality of terminals for communicating information to and from memory devices on the memory module, and a second plurality of terminals for receiving a module address. A module address of a desired memory module is communicated to the plurality of memory modules via the second plurality of terminals. Each memory module is then operable to connect the first plurality of terminals to the memory bus responsive to receiving a module address corresponding to the memory module, and to disconnect the first plurality of terminals from the memory bus responsive to receiving a module address not corresponding to the memory module.

A technical advantage of the present invention is the ability to control the electrical connection to an integrated circuit assembly such that the assembly can be isolated. While isolated, the integrated circuit assembly can, for example, be disconnected from a system bus in a computer system. One type of integrated circuit assembly to which this can be applied is a memory module that provides system memory.

A further technical advantage of the present invention is the mounting of memory devices on a modular board similar to existing SIMMs but with an input/output (I/O) circuit for interface control. The interface control handles signal integrity at the board level and isolates the memory module, when not being addressed, from the system bus. Thus, by isolating the memory module, the load on the bus is reduced thereby allowing more efficient driving of signals on the bus especially at high frequency. This advantage can apply to providing selectability for other configurations and other integrated circuit assemblies.

BRIEF DESCRIPTION OF THE DRAWINGS

A more complete understanding of the present invention may be acquired by referring to the following description taken in conjunction with the accompanying drawings, in which like reference numbers indicate like features, and wherein.

DETAILED DESCRIPTION OF THE INVENTION

Figure 1A:
FIGS. 1A and 1B are block diagrams of one embodiment of a selectable memory module constructed according to the teachings of the present invention.
Figure 1B:
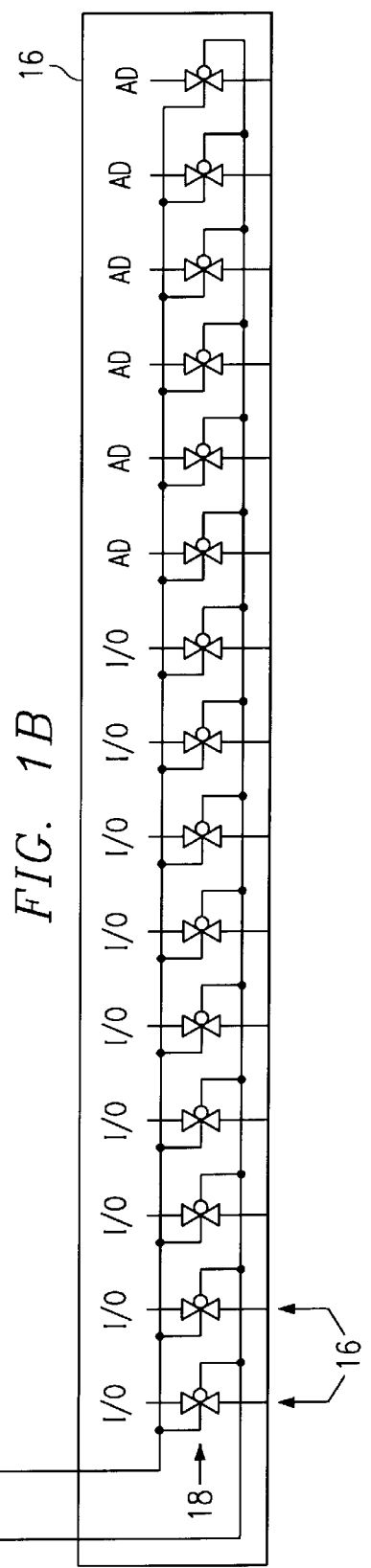

FIGS. 1A and 1B are block diagrams of one embodiment of a selectable memory module constructed according to the teachings of the present invention. As shown in FIG. 1A, a memory module 10 is connected to a bus 12 for communicating with other components of a computer system. As shown in FIG. 1B, memory module 10 includes module select logic 14 and a plurality of terminals 16. A plurality of switches 18 are connected to terminals 16 to allow disconnection of memory module 10 from and connection of memory module 10 to bus 12. It should be understood that although a memory module is shown, the selectability provided by the present invention is applicable to other integrated circuit assemblies as well. In the illustrated embodiment, terminals 16 comprise address and I/O pins of memory module 10, and switches 18 comprise T-gates that connect between pins 16 and remaining circuitry of memory module 10. T-gates 18 of FIGURE 1B allow each I/O and address pin 16 of memory module 10 to be electrically connected to or disconnected from bus 12. In this manner, memory module 10 can both be connected to and load bus 12 and be disconnected from and not load bus 12. Other types of switches could also be used in place of T-gates 18 to provide selectability via electrically controllable connections to memory module 10.

Memory module 10 adds more to the load on bus 12 (e.g., about ten picofarads) when selected than it adds to the load on bus 12 (e.g., about 0.1 picofarads) when not selected. According to the present invention, memory module 10 is selectable and can be isolated using T-gates 18. Thus, when not needed, memory module 10 is not selected and is disconnected from bus 12. This selectability helps both drive current and reduces reflections at lower power and higher speed.

In one embodiment, T-gates 18 are implemented using bipolar devices for speed, for example, gallium arsenide (GaAs) devices. An example of such an embodiment is illustrated in and described with respect to FIG. 9 below. T-gates 18 can also be implemented as field effect transistor (FET) switches. Such switches will pass, when on, approximately 25 ohms resistance. When off, the FET switches provide an open circuit with approximately infinite resistance. The capacity generated by the off FET switches is approximately 0.3 picofarads at the bond pad. Other implementations for T-gates 18 are possible which would generate different on resistance and off capacity.

As shown in the embodiment of FIGS. 1A and 1B, module select logic 14 provides two signals. These signals operate to turn on T-gates 18 to connect the I/O and address pins to bus 12 when memory module 10 is selected. Conversely, these signals operate to turn off T-gates 18 to disconnect memory module 10 from bus 12 when memory module 10 is not selected. It should be understood that T-gates 18 and the signals from module select logic 14 comprise one embodiment of making memory module 10 selectable and that this function could be implemented in other ways consistent with the teachings of the present invention.

Figure 2:
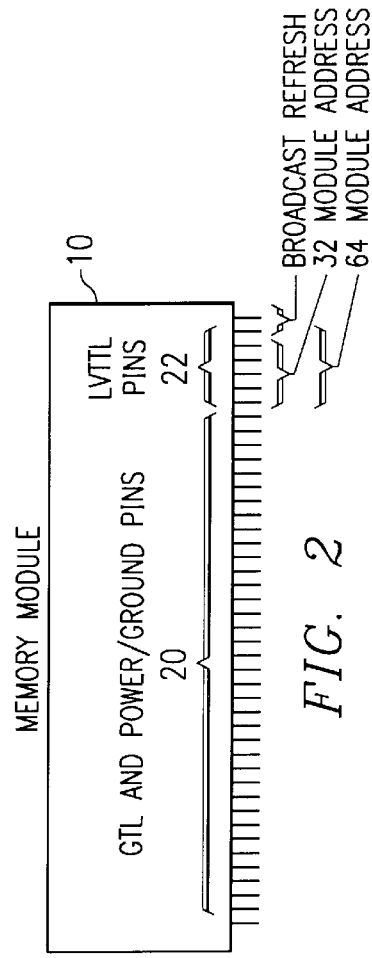
FIG. 2 is a block diagram of one embodiment of pins of a selectable memory module constructed according to the teachings of the present invention.

FIG. 2 is a block diagram of one embodiment of pins of a selectable memory module 10 constructed according to the present invention. As shown, memory module 10 includes a plurality of pins 20 which provide gunning transistor logic (GTL) and power/ground pins for memory module 10. In addition, a plurality of pins 22 are LVTTL (low voltage transistor-transistor logic) pins which provide addressing of memory module 10. Other embodiments with alternate pin structures are also possible.

In the embodiment of FIG. 2, the address pins 22 can be used five or six at a time to signal a unique module address. The address pins 22 provide a module address that allows a memory module 10 to be selected to enable interface pins 20. It should be understood that with a 5-pin module address, one of 32 modules can be selected, and with a 6-pin module address, one of 64 modules can be selected. Memory module 10 can further include a broadcast refresh pin, as shown. This pin allows memory module 10 to receive a broadcast refresh signal even though memory module 10 is not currently selected. In this manner, all memory modules can be signaled to refresh without having to be selected. Upon refresh, memory module 10 can, for example, refresh data stored in DRAM cells to maintain data integrity.

Figure 3:
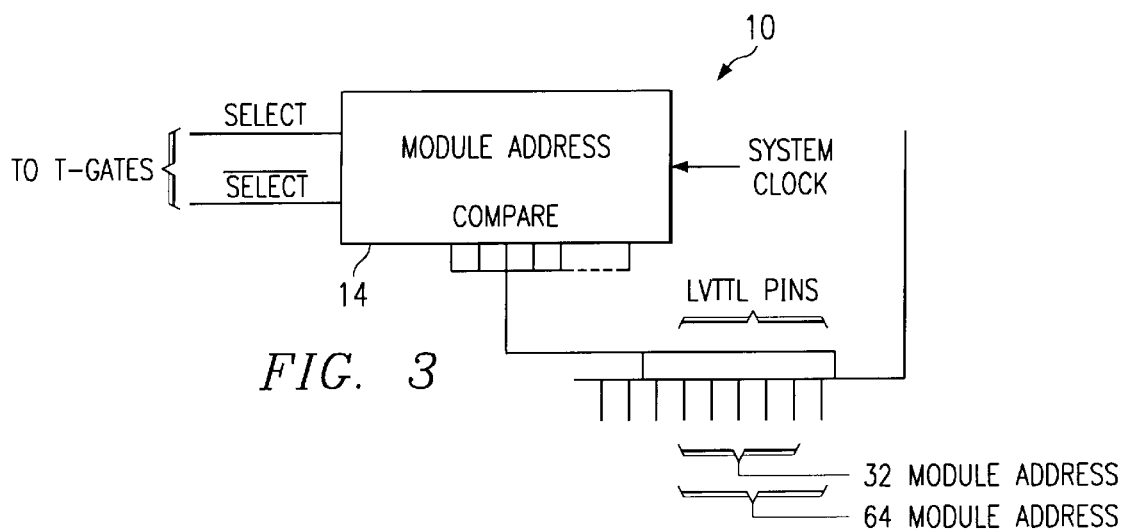
FIG. 3 is a block diagram of one embodiment of using module address pins to determine whether or not to select a given memory module according to the teachings of the present invention.

FIG. 3 is a block diagram of one embodiment of using module address pins to determine whether or not to select a given memory module according to the teachings of the present invention. As shown in FIG. 3, memory module 10 can include module address compare logic 14 which receives a system clock as well as the memory module address pins. Module address compare logic 14 operates to analyze the memory module address by comparing it to an address associated with the memory module. The module address compare logic 14 then drives a select signal, SELECT, and a select bar signal, $\overline{\text{SELECT}}$. When the memory module is addressed, the SELECT signal is driven high. Conversely, when the memory module is not addressed, the SELECT signal is driven low. The SELECT and $\overline{\text{SELECT}}$ signals are provided, for example, to the T-gates gates on memory module 10 in order to connect or disconnect memory module 10 from the bus. The module address can be gated by the system clock to insure that turn-off and turn-on of the modules occurs such that only one module is active at the same time. It should be understood that, depending upon the specific application, more than one memory module may need to be selected at one time. This could be accomplished, for example, by giving two or more memory modules the same address.

Figure 4:
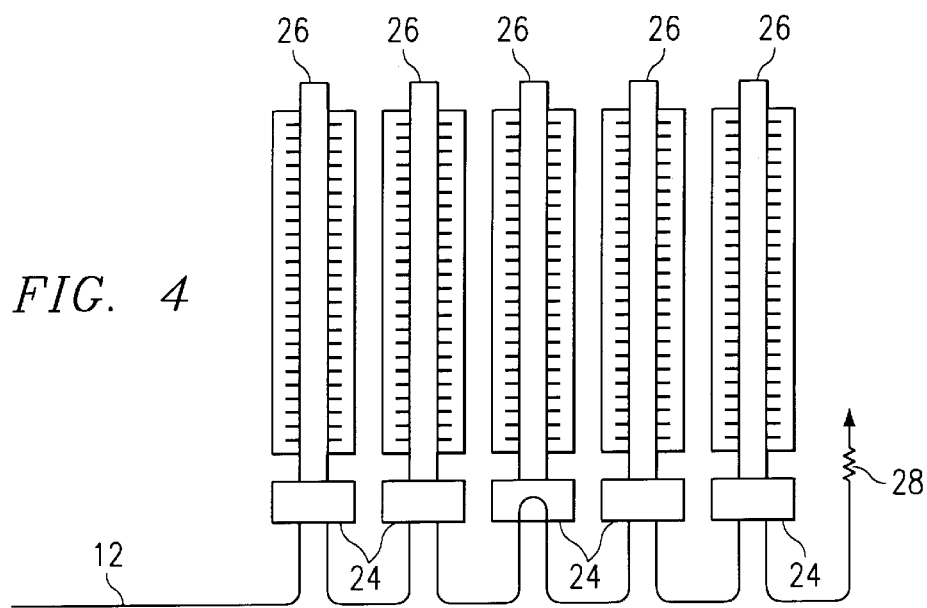
FIG. 4 is a block diagram of one embodiment of a selected memory module within a bus scheme according to the present invention.

FIG. 4 is a block diagram of one embodiment of a selected memory module within a bus scheme according to the teachings of the present invention. As shown, a plurality of memory modules 26 are connected to memory sockets 24 which connect to a memory bus 12. In this embodiment, memory bus 12 is terminated by a resistor 28 connected to a power supply. As shown, the middle memory module 26 is currently selected and connected to memory bus 12. In this situation, the other memory modules 26 are isolated from bus 12 and do not load the system bus 12. The only memory module loading the system is the middle memory module 26 while the other memory modules 26 appear as a negligible load on bus 12 (e.g., about 0.1 picofarads). This selectability can provide significant advantages in a system where bus 12 services a large number of memory modules or other integrated circuit assemblies.

Figure 5:
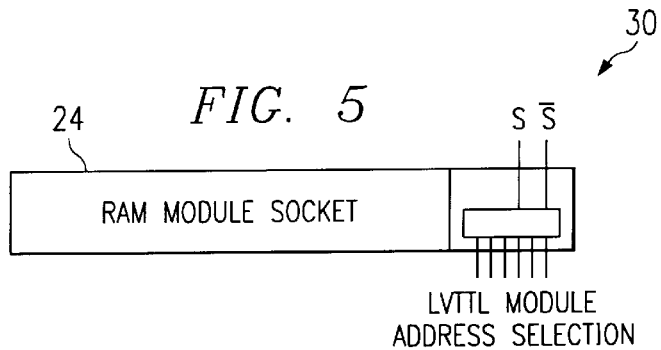
FIG. 5 is a block diagram of one embodiment of a selectable memory module socket constructed according to the teachings of the present invention.

FIG. 5 is a block diagram of one embodiment of a module socket 24 constructed according to the teachings of the present invention. Module socket 24 includes select logic 30 which receives memory module address pins and provides the selection signals, S and $\overline{S}$. In this embodiment, module selection is handled by each socket location. The particular address for a particular module socket 24 can be, for example, burned into a printed circuit (PC) board at build time or can be hardwired to the board. In this case, the only signals going to the memory module, itself, can be the select, S, and select bar, $\overline{S}$, signals. This reduces the number of pins needed on the memory modules.

Figure 6:
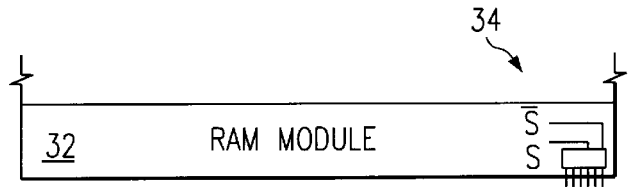
FIG. 6 is a block diagram of a selectable memory module constructed according to the teachings of the present invention.

FIG. 6 is a block diagram of one embodiment of a memory module 32 constructed according to the teachings of the present invention. Memory module 32 includes select logic, indicated generally at 34, that receives memory module address signals and provides the selection signals, S and $\overline{S}$. In this embodiment, module selection is handled by each memory module 32. This embodiment adds address compare and decode cost to the memory modules themselves and requires additional pins for addressing the memory module. However, this embodiment would decrease the complexity of the printed circuit board and module socket in which memory module 32 might be installed.

Figure 7:
FIG. 7 is a block diagram of another embodiment of a selectable memory module socket constructed according to the teachings of the present invention.

FIG. 7 is a block diagram of another embodiment of a module socket constructed according to the teachings of the present invention. As shown, module socket 36 is connected to select logic, indicated generally at 38, that receives a memory module address and provides the selection signals, S and $\overline{S}$. In this embodiment, module selection is handled by select logic 38 built into the printed circuit board at each socket location. This embodiment adds decode costs to the printed circuit board construction but only requires two pins to the memory module. This would reduce the memory module cost and socket connector cost but add to the cost of the board.

Figure 8A:
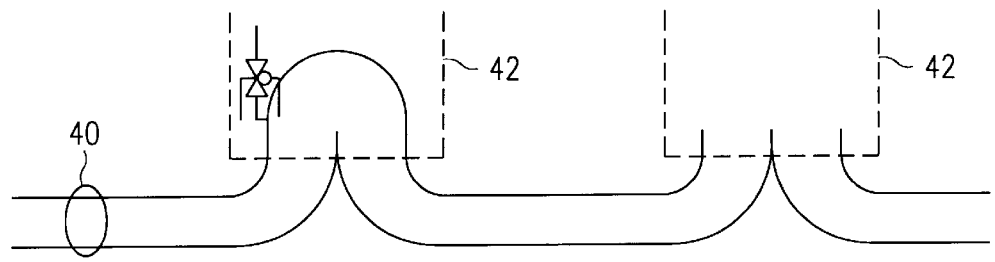
FIGS. 8A, 8B and 8C are diagrams of embodiments of bus termination according to the teachings of the present invention.
Figure 8B:
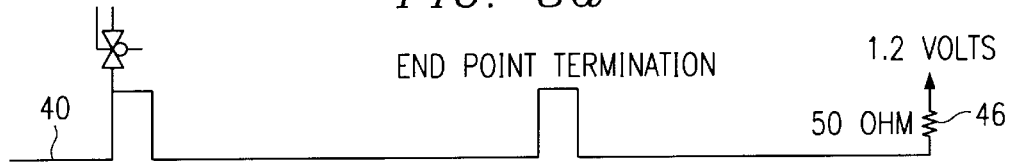
Figure 8C:
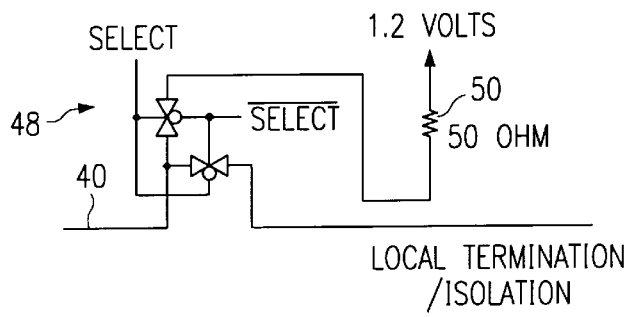

FIGS. 8A, 8B and 8C are diagrams of embodiments of bus termination according to the teachings of the present invention. As shown in FIG. 8A, a bus 40 connects to two memory modules 42 where each memory module 42 is selectable in the manner discussed above. FIG. 8B then shows end point termination of bus 40. As shown in FIG. 8B, bus 40 is terminated after passing through all memory modules 42. This end point termination is shown generally at 44. In the embodiment of FIG. 8B, the termination is accomplished using a 50 ohm resistor 46 which is then connected to a positive power supply, for example, 1.2 volts.

FIG. 8C shows an alternative local termination for bus 40 at each memory module 42. As shown in FIG. 8C, two sets of switches, indicated generally at 48, receive the module selection signals, SELECT and $\overline{\text{SELECT}}$. When the associated module is selected, the module is connected to bus 40 by one set of switches 48. Alternatively, when the module is not selected, bus 40 is locally terminated by connection to a resistor 50, for example, 50 ohms, which is then connected to a positive power supply, for example, 1.2 volts.

The termination method provided by FIG. 8B provides efficient termination of bus 40, however, such end point termination can add stub noise to the signal. The embodiment of FIG. 8C is also an efficient means for termination. However, such local termination can add approximately 25 ohms to the path in each module location.

Figure 9:
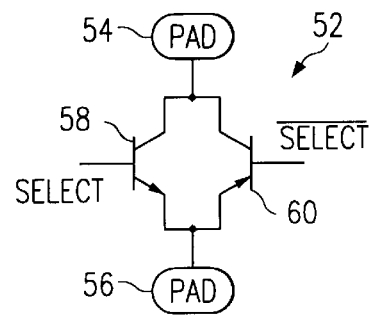
FIG. 9 is a circuit diagram of one embodiment of a switch for a selectable memory module according to the teachings of the present invention.

FIG. 9 is a circuit diagram of one embodiment of a switch, indicated generally at 52, used to select an integrated circuit assembly according to the teachings of the present invention. As shown, switch 52 connects between a first pad 54 and a second pad 56, which comprise bond pads connecting between the bus and the integrated circuit assembly. Switch 52 is built from an NPN bipolar transistor. 58 and a PNP bipolar transistor 60. NPN transistor 58 receives a module selection signal, SELECT PNP transistor 60 receives an inverse module selection signal, $\overline{\text{SELECT}}$. As can be seen, when the assembly is to be selected (SELECT is high and $\overline{\text{SELECT}}$ is low), both NPN transistor 58 and PNP transistor 60 will turn on and connect pad 54 to pad 56. Conversely, when the selection signal is low, NPN transistor 58 and PNP transistor 60 will turn off, thus disconnecting pad 54 from pad 56. In one embodiment, bipolar transistors 58 and 60 can be constructed from silicon or gallium arsenide to provide high speed switching between pads 54 and 56.

Figure 10:
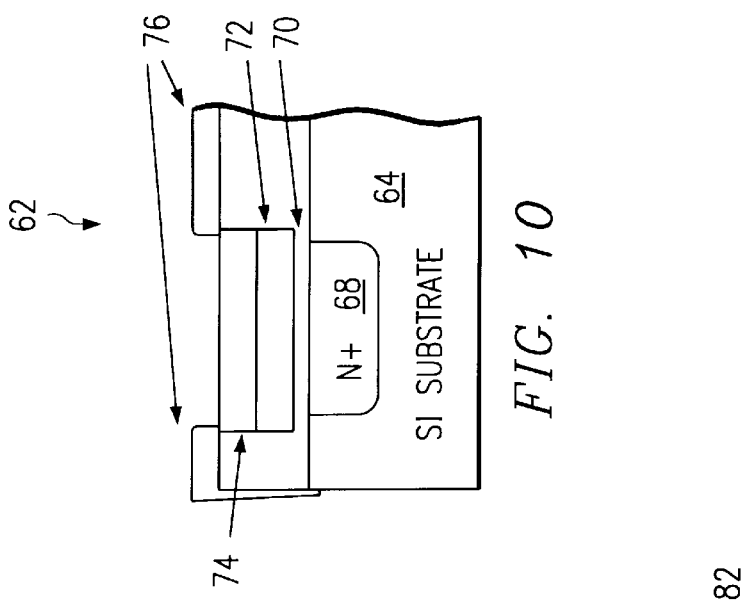
FIG. 10 is a cross section diagram of one embodiment of an integrated circuit bond pad.

FIG. 10 is a cross section diagram of one embodiment of a bond pad for an integrated circuit constructed according to the teachings of the present invention. As shown, pad 62 is built upon a silicon substrate 64 having an N+ doped region 68. An oxide layer 70 is formed above silicon substrate 64 and N+region 68. A first metal layer 72 and a second metal layer 74 are then used to construct a connecting surface for pad 62. Lastly, an oxide layer 76 is formed over the structure to protect the integrated circuit. Pad 62 of FIG. 10 can be constructed as a 125×125 millimeter bond pad which can yield approximately 0.3 picofarads of capacitance. If the pad is reduced using a tab bond to 0.85 per side, the capacitance can be reduced to approximately 0.125 or 0.2 picofarads. It should be understood that the process for building a bond pad for an integrated circuit can vary and can be accomplished in a manner different from that shown in FIG. 10.

Figure 11:
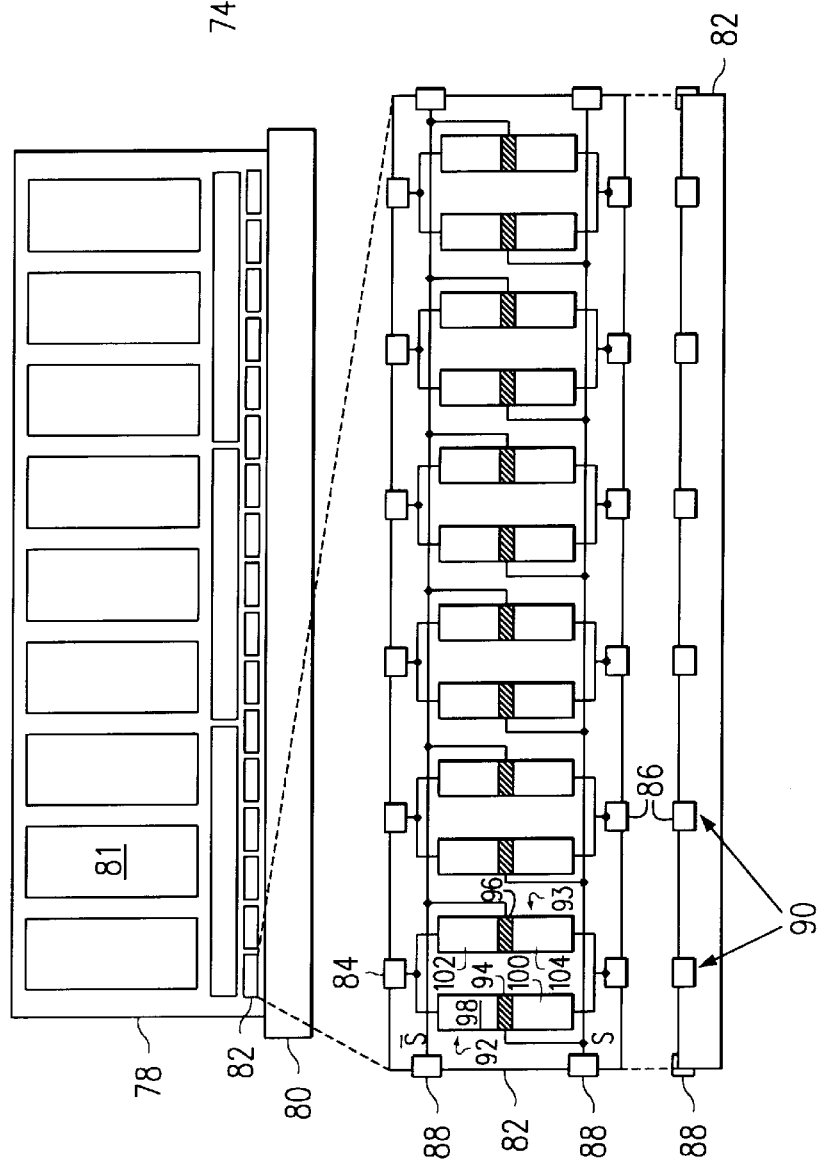
FIG. 11 is a block diagram of switches on a selectable memory module constructed according to the teachings of the present invention.

FIG. 11 is a block diagram of one embodiment of a memory module 78 and memory module socket 80 constructed according to the teachings of the present invention. Memory module 78 includes a plurality of memory devices 81 and a plurality of interconnect devices 82. Each interconnect device 82 comprises a plurality of upper bond pads 84 and lower bond pads 86. Each interconnect device 82 also includes a plurality of selection signal terminals 88 for the signals s and $\overline{S}$. Bond pads 84 and 86 are used by interconnect device 82 to connect pins of memory module 78 with memory devices 81 and with other devices on memory module 78. As shown, a pitch 90 of bond pads 84 and 86 can match module connector pins within module socket 80.

Within each interconnect device 82 of FIG. 11 there is an integrated circuit containing a plurality of transistors 92. The transistors 92 can be paired as an NPN bipolar transistor 92 and a PNP bipolar transistor 93 for each pair of upper and lower bond pads 84 and 86. NPN transistor 92 comprises a base 94 connected to the S signal, and PNP transistor 93 comprises a base 96 connected to the $\overline{S}$ signal. NPN transistor 92 further comprises a collector 98 and an emitter 100. Similarly, PNP transistor 93 comprises a collector 102 and an emitter 104. Alternately, the transistors 92 could be field effect transistors (FET) or other forms of switches.

When the appropriate select signals are presented on bond pads 88, those signals are carried to transistors 92 to connect bond pad 84 with bond pad 86. In the illustrated embodiment, the signals from bond pads 88 are carried to the base of bipolar transistors 92 and 93. Alternatively, those signals are carried to the gates of field effect transistors or to control terminals of other types of switches. As can be seen, the connection between upper bond pads 84 and lower bond pads 86 can thereby be selectably controlled. When bond pads 84 and 86 are connected, memory devices 81 and other devices on memory module 78 are connected to the signals received by memory module socket 80. This allows memory module 78 to be active within the system. Conversely, when bond pads 84 and 86 are not connected, memory module 78 is inactive and disconnected from socket 80. It should be understood that implementations other than that if FIG. 11 are possible to provide selectability of integrated circuit assemblies consistent with the teachings of the present invention.

Although the present invention has been described in detail, it should be understood that various changes, substitutions and alterations can be made thereto without departing from the spirit and scope of the invention as defined by the appended claims.

What is claimed is:

1. A selectable memory module, comprising:

a first plurality of terminals connected to communicate information to and from memory device on the memory module;

a second plurality of terminals connected to receive a module address;

module select logic connected to receive the module address and operable to generate module select signals based upon the module address, the module select signals having a selected state and a not-selected state;

a plurality of switches connected between the first plurality of terminals and the at least one memory devices, the plurality of switches connected to receive the module select signals, and the switches operable:

when the module select signals are in the selected state, to connect the first plurality of terminals to the memory devices; and when the module select signals are in the non-selected state, to disconnect the first plurality of terminals from the memory devices.

2. The selectable memory module of claim 1, wherein the first plurality of terminals comprise input/output pins and address pins for the memory module.

3. The selectable memory module of claim 1, wherein the first plurality of terminals comprise GTL pins and power/ground pins.

4. The selectable memory module of claim 1, wherein the second plurality of terminals comprise LVTTL pins.

5. The selectable memory module of claim 1, wherein:

the memory module further comprises a module socket; and the module select logic is formed as a part of the module socket.

6. The selectable memory module of claim 1, wherein the module select signals comprise a SELECT and a $\overline{\text{SELECT}}$ signal.

7. The selectable memory module of claim 1, wherein:

the module select logic comprises a module address compare logic connected to receive the module address; and the module select logic is operable to compare the module address with a stored address for the memory module and to generate the module select signals in response to the comparison.

8. A method for selecting a memory module on a memory bus, comprising:

connecting a plurality of memory modules to a memory bus, where each memory module comprises:

a first plurality of terminals for communicating information between the memory bus and memory devices on the memory module; and a second plurality of terminals for receiving a module address; and communicating a module address of a desired memory module to the plurality of memory modules via the second plurality of terminals;

each memory module operable:

to connect the first plurality of terminals to at least one of the memory devices responsive to receiving a module address corresponding to the memory module; and to disconnect the first plurality of terminals from the memory devices responsive to receiving a module address not corresponding to the memory module.

9. The method of claim 8, wherein the first plurality of terminals comprise input/output pins and address pins for each memory module.

10. The method of claim 8, wherein the first plurality of terminals of each memory module comprise GTL pins and power/ground pins.

11. The method of claim 8, wherein the second plurality of terminals of each memory module comprise LVTTL pins.

12. The method of claim 8, wherein each memory module comprises a module socket, and the module socket includes module select logic that receives the module address.

13. The method of claim 12, wherein the module select logic comprises a module address compare logic connected to receive the module address, and the module select logic is operable to compare the module address with a stored address for the memory module and to generate module select signals in response to the comparison.

14. An integrated circuit module comprising:

a first plurality of terminals for connecting the module to a system bus, the first plurality of terminals coupled to a plurality of terminals of at least one integrated circuit located on the module;

a second plurality of terminals for receiving a module address;

module select logic having at least one input coupled to the second plurality of terminals and generating at least one select signal in response to the module address received at the second plurality of terminals; and a plurality of switches connected between the first plurality of terminals and the plurality of terminals of the at least one integrated circuit, the switches connecting the plurality of terminals of the at least one integrated circuit to the first plurality of terminals in response to a selected state of the at least one select signal and the switches disconnecting the plurality of terminals of the at least one integrated circuit from the first plurality of terminals in response to a not-selected state of the at least one select signal.

15. The integrated circuit module of claim 14, wherein the at least one integrated circuit is a memory device.

16. The integrated circuit module of claim 15, wherein the memory device is a dynamic random access memory device.

17. The integrated circuit module of claim 16 further comprising a broadcast refresh pin connected to receive a broadcast refresh signal.

18. The integrated circuit module of claim 16, wherein the first plurality of terminals comprise input/output pins and address pins of the integrated circuit module.

19. The integrated circuit module of claim 14, wherein the system bus is terminated locally at the integrated circuit module when the integrated circuit module is not selected.

20. The integrated circuit module of claim 14, wherein the plurality of switches are T-gates.

21. The integrated circuit module of claim 20, wherein the T-gates are comprised of field effect transistors.

22. The integrated circuit module of claim 20, wherein the T-gates are comprised of bipolar transistors.

23. The integrated circuit module of claim 22, wherein the T-gates are gallium arsenide devices.

24. The integrated circuit module of claim 14, wherein the at least one select signal comprises a SELECT and a $\overline{\text{SELECT}}$ signal.

25. The integrated circuit module of claim 14, wherein the module select logic comprises a module address compare logic having an input connected to receive the module address and operable to compare the module address with a stored address for the integrated circuit module and to provide the at least one select signal at its output in response to the comparison.

26. The integrated circuit module of claim 14, wherein the first plurality of terminals comprise GTL pins and power/ground pins.

27. The integrated circuit module of claim 14, wherein the second plurality of terminals comprise LVTTL pins.

28. The integrated circuit module of claim 15, wherein the system bus is located on a personal computer mother board and the integrated circuit module is a memory module containing a plurality of synchronous random access memory devices.

29. An integrated circuit module assembly comprising:
   a integrated circuit module comprising:
      a first plurality of terminals for connecting to a system bus, the first plurality of terminals coupled to a plurality of terminals of at least one integrated circuit located on the module;
      at least one second terminal connected to receive at least one select signal;
      a plurality of switches connected between the first plurality of terminals and the plurality of terminals of the at least one integrated circuit;
   a module socket interfaced with the integrated circuit module comprising:
      module select logic having at least one input for receiving a module address, the module select logic generating the at least one select signal in response to the module address; and
   wherein the switches connect the plurality of terminals of the at least one integrated circuit to the first plurality of terminals in response to a selected state of the at least one select signal and the switches disconnect the plurality of terminals of the at least one integrated circuit from the first plurality of terminals in response to a not-selected state of the at least one select signal.

30. The integrated circuit module assembly of claim 29, wherein the module select logic comprises a module address compare logic having an input connected to receive the module address and operable to compare the module address with a stored address for the integrated circuit module and to provide the at least one select signal at its output in response to the comparison.

31. The integrated circuit module assembly of claim 29, wherein the at least one integrated circuit is a dynamic random access memory device and wherein the first plurality of terminals comprise input/output pins and address pins for the integrated circuit module.

* * * * *